United States Patent [19]
Herzl

[11] Patent Number: 6,102,112
[45] Date of Patent: Aug. 15, 2000

[54] THERMALLY CONDUCTIVE SUPPORT STRUCTURE

[75] Inventor: Alfred Herzl, Littleton, Colo.

[73] Assignee: Lockheed Martin Corporation, Bethesda, Md.

[21] Appl. No.: 09/027,830

[22] Filed: Feb. 17, 1998

[51] Int. Cl.$^7$ ................................................ H05K 7/20
[52] U.S. Cl. .................... 165/185; 165/905; 165/906; 361/707; 361/711; 361/716
[58] Field of Search ...................... 165/185, 905, 165/906; 361/704, 707, 709–711, 714–716

[56] References Cited

U.S. PATENT DOCUMENTS

| | | |
|---|---|---|
| 4,057,101 | 11/1977 | Ruka et al. . |
| 4,299,872 | 11/1981 | Miguel et al. . |
| 4,546,028 | 10/1985 | Val . |
| 4,591,659 | 5/1986 | Liebowitz ............................ 361/705 X |
| 4,837,664 | 6/1989 | Rodriguez, II et al. ............. 165/185 X |
| 4,849,858 | 7/1989 | Grapes et al. ........................... 361/708 |
| 4,867,235 | 9/1989 | Grapes et al. ........................... 165/185 |
| 4,878,152 | 10/1989 | Sauzade et al. ..................... 165/185 X |
| 4,884,631 | 12/1989 | Rippel . |
| 4,996,115 | 2/1991 | Eerkes et al. . |
| 5,111,359 | 5/1992 | Montesano ......................... 165/185 X |
| 5,224,030 | 6/1993 | Banks et al. . |
| 5,287,248 | 2/1994 | Montesano ......................... 165/185 X |
| 5,288,537 | 2/1994 | Corden . |
| 5,296,310 | 3/1994 | Kibler et al. . |
| 5,306,571 | 4/1994 | Dolowy, Jr. et al. ............... 361/707 X |
| 5,316,080 | 5/1994 | Banks et al. . |
| 5,390,734 | 2/1995 | Voorhes et al. . |
| 5,407,727 | 4/1995 | Newell . |
| 5,415,715 | 5/1995 | Delage et al. . |
| 5,466,507 | 11/1995 | Darfler . |
| 5,468,918 | 11/1995 | Kanno et al. ....................... 361/751 X |
| 5,470,633 | 11/1995 | Darfler . |
| 5,527,584 | 6/1996 | Darfler et al. . |
| 5,542,471 | 8/1996 | Dickinson . |
| 5,715,140 | 2/1998 | Sinkunas et al. ....................... 361/690 |

OTHER PUBLICATIONS

Author Unknown Dialead Technical Information, "Scanning Electron Micrograph of Carbon Fibers," Date Unknown.
Bryte, Technologies, Inc., "Enacting Materials for the Composites Industry," Feb. 1994.

*Primary Examiner*—Leonard Leo
*Attorney, Agent, or Firm*—Holme Roberts & Owen LLP

[57] ABSTRACT

A structure for supporting and at least transferring heat energy away from at least a first heat source interconnected thereto is disclosed. In one embodiment, the structure includes a deck member having a plurality of layers of thermally conductive fibers packed within a matrix material. Fibers of at least a first layer are orientable to transfer heat energy toward at least a first sidewall of the deck member, and fibers of at least a second layer are orientable about ±45° relative to the fibers of the first layer to enhance the structural strength of the deck member. In another embodiment, fibers of at least a first layer of thermally conductive fibers of the deck member are orientable to transfer heat energy from a first heat source to a second, cooler heat source, both of which are interconnectable to the deck member, such that the first and second heat sources operate at substantially uniform temperatures. In this embodiment, fibers of at least a second layer of thermally conductive fibers are orientable about ±45° relative to the fibers of the first layer to enhance the structural strength of the deck member. Fibers of at least a third layer of thermally conductive fibers are orientable substantially orthogonally relative to the fibers of the first layer to transfer heat energy away from at least the first heat source to at least a first sidewall of the deck member.

32 Claims, 7 Drawing Sheets

THERMALLY CONDUCTIVE SUPPORT STRUCTURE

GOVERNMENT RIGHTS

This invention was made with Government support under NASA Contract No. NAS7-1260 to Lockheed Martin Corp. and the Government has certain rights in this invention.

FIELD OF THE INVENTION

The present invention generally relates to structures for supporting one or more devices thereon, and, in particular, to a support structure for conducting heat energy at least away from a heat source interconnected thereto.

BACKGROUND OF THE INVENTION

Generally, for purposes of optimizing operating performance and efficiency of a heat source, such as a motor or semiconductor chip, it is desirable to transfer heat energy away from the heat source. Over the years, many methods and systems have been developed to transfer heat energy away from the heat sources, such as by conductive, convective and/or radiative heat transfer techniques. For example, numerous systems having a heat source therein have utilized a fan to blow or force air over the heat source to cool the heat source. Other systems enclosing a heat source in a box have routed heat pipes containing cooling fluids through the box enclosing the heat source to cool the heat source. In other instances, metal structures, such as fins, have been attached to heat sources to transfer heat energy away from the heat source. However, in view of size, weight and power restrictions of certain vehicles, such as spacecraft and aircraft, such cooling systems are not always usable or practical. Therefore, there is a need to provide a lightweight cooling system or heat transfer structure which is suitable for use on a vehicle, such as a spacecraft or aircraft.

SUMMARY OF THE INVENTION

Accordingly, it is an object of the present invention to provide a thermally conductive structure for supporting a heat source mounted thereon.

It is another object of the present invention to provide a thermally conductive support structure which is suitable for use on vehicles, such as spacecraft and aircraft.

It is yet another object of the present invention to provide a structure which is capable of supporting and transferring heat energy away from a plurality of heat sources interconnected thereto.

It is still another object of the present invention to provide a structure which is capable of maintaining uniformity in temperatures of adjacently positioned heat sources while transferring heat away from such heat sources.

The present invention achieves one or more of these objectives by providing a thermally conductive structure which is capable of supporting and transferring heat energy away from one or more heat sources interconnected thereto. Generally, the structure of the present invention includes a first deck member or structure to which one or more heat sources may be interconnected. For purposes of providing a lightweight structure suitable for use on vehicles and capable of supporting and conductively transferring heat energy away from at least a first heat source interconnected thereto, the deck member or structure may be fabricated from a non-metallic, composite material having a high thermal conductivity. In this regard, in one embodiment, the deck structure is fabricated from at least a first plurality of graphite fibers having a thermal conductivity of at least about 200 W/m-K along a longitudinal axis of the fibers, the graphite fibers being packed within a matrix material such that heat energy is transferable at least from fiber to fiber as at least a portion of a first fiber may contact at least a portion of another fiber to transfer heat energy from fiber to fiber. In addition, for purposes of enhancing the thermal conductivity of the deck structure, the matrix material may also be thermally conductive. The packing density of graphite fibers within the matrix material should be at least 40%, or, more preferably, at least about 50%, or, in another preferable embodiment, between about 50% and about 60%, to optimize heat transfer capabilities of the deck structure. In one preferable embodiment, the packing density of the fibers within the matrix material of the deck structure is about 58%. A deck structure fabricated from such fibers packed within matrix material is especially advantageous for use on spacecraft or other aerospace vehicles, since it has a density of only about 0.06 pounds/inch$^3$, as opposed to metals, such as aluminum, which can have a density of about 0.1 pounds/inch$^3$.

In one embodiment, for purposes of conductively transferring heat energy away from a heat source interconnected thereto, at least the first plurality of graphite fibers packed within the matrix material of the deck structure may be oriented in a first direction. In this regard, heat energy from at least a first heat source is transferable away from the first heat source, in at least the first direction (e.g., 0°). For instance, in order to conduct heat energy toward first and/or second sides or sidewalls of a rectangular or square deck structure, the first sidewall being opposite the second sidewall of the deck structure, at least the first plurality of graphite fibers packed within the matrix material may be oriented substantially orthogonally relative to the first and second sidewalls. Alternatively, the thermally conductive fibers may be oriented substantially parallel to the first and second opposing sidewalls to transfer heat energy towards first and second ends or end walls of the deck structure. In this regard, the thermally conductive fibers may be oriented in any direction(s) to transfer heat energy away from a heat source mounted on the deck structure. Of course, the deck structure can be of other cross-sectional configurations, such as triangular, circular, or polygonal, and the thermally conductive fibers may be oriented to transfer heat energy towards one or more side walls or edges of such deck structures.

In one embodiment, the deck structure comprises a plurality of layers of thermally conductive fibers packed within a matrix material, whereby the fibers in at least a first of the plurality of layers are oriented substantially orthogonally relative to at least the first sidewall of the deck structure (e.g., longitudinal axes of fibers generally pointing in a first direction, 0°, toward at least the first sidewall). As such, heat energy from a first heat source thermally interconnected to the deck structure is transferable via the fibers toward at least the first sidewall. Thereafter, heat energy may be transferred away from the deck structure convectively, conductively or radiatively. For example, where the first sidewall is exposed to the atmosphere or space, heat energy may be convectively or radiatively transferred away from the first sidewall.

In another aspect of the present invention, instead of transferring heat energy away from heat sources to cool the heat sources, in some instances, it may desirable to maintain uniformity in temperature of adjacently positioned heat sources. As such, the deck structure of the present invention may function to conductively transfer heat energy from a first heat source toward a second heat source, both of which are interconnectable to the deck structure. For example, in instances where the plurality of heat sources interconnected to the deck structure of the present invention include a plurality of battery cells, for purposes of optimizing the useable life of the batteries, it is desirable that the battery cells operate at substantially similar voltage levels. In this regard, it is desirable to maintain substantial uniformity in temperature from battery to battery. Accordingly, the deck structure of the present invention may include at least a first plurality of thermally conductive fibers oriented within the matrix material to point substantially toward at least one battery (e.g., parallel to the first and second sidewalls of the deck structure) for conductively transferring heat energy between the first and second batteries to maintain uniformity in temperature from battery to battery. The deck structure may further include at least a second plurality of thermally conductive fibers oriented within the matrix material substantially orthogonally relative to the fibers of first plurality of thermally conductive fibers for conductively transferring heat energy away from the batteries, towards, for example, at least a first and/or second sidewalls of the deck structure, to cool the batteries. In this regard, for purposes of cooling a plurality of batteries while substantially maintaining uniformity in temperature of the plurality of batteries, at least the first plurality of thermally conductive fibers are perpendicular to at least the second plurality of thermally conductive fibers. In one embodiment, the deck structure includes a plurality of layers of thermally conductive fibers packed within a matrix material, whereby at least a first of the plurality of layers of thermally conductive fibers are oriented within the matrix material substantially orthogonally to the first and second opposing sidewalls to transfer heat energy toward the first and second sidewalls to cool the heat sources interconnected to the deck structure, and at least a second of the plurality of layers of thermally conductive fibers are oriented within the matrix material substantially orthogonally to the fibers in the first of the first plurality of layers of thermally conductive fibers (e.g., parallel to the opposing first and second sidewalls) to transfer heat from one heat source to another heat source to maintain uniformity in temperatures of the heat sources. Alternatively, the thermally conductive fibers of the deck structure may be oriented within the matrix material in the same direction or between about 0° and about ±90° relative to each other, depending upon the position of the batteries on the deck structure relative to one another and the desired direction of heat energy transfer, to conductively transfer heat energy away from at least first and second batteries to cool the batteries and/or to conductively transfer heat energy between first and second batteries to inhibit significant variations in temperature of the first and second batteries.

For purposes of enhancing the structural strength/stiffness and/or heat transfer capabilities of the deck structure, the deck structure may include a plurality of fibers oriented within a matrix material in a direction different than the first direction. For example, where a first plurality of fibers are oriented within a matrix material in a first direction (e.g., 0°) to transfer heat energy away from a heat source, a second plurality of fibers within a matrix material may be oriented between about −90° and about +90° relative to the fibers of the first plurality of fibers to enhance the structural strength and/or heat transfer capabilities of the deck structure. In this regard, the fibers of the second plurality of fibers may be oriented at various angles relative to the fibers of the first plurality of fibers (e.g., substantially about ±30°, ±45°, ±60°, etc.), relative to the plurality of thermally conductive fibers oriented in the first direction. Such fibers may be thermally conductive to further enhance cooling of the heat sources mounted on the deck structure, or alternatively, not thermally conductive. In one embodiment, the deck structure comprises at least a first of a plurality of layers of thermally conductive fibers packed within a matrix material, the fibers in at least the first of the plurality of layers being oriented one or substantially orthogonally relative to the opposing first and second sidewalls of the deck structure (e.g., 0°), to transfer heat energy away from a heat source towards, for example, the first and/or second sidewalls of the deck structure, or oriented such that the longitudinal axis of the fibers point generally toward a heat source. In addition to at least this first of the plurality of layers of thermally conductive fibers, the deck structure may include at least a second of the plurality of layers of fibers packed within a matrix materials to enhance the structural strength of the deck structure and to transfer heat energy away from the heat source, the fibers of at least this second of the plurality of layers being oriented about ±45° relative to the fibers of at least the first of the plurality of layers of thermally conductive fibers packed within a matrix material.

For purposes of enhancing the structural strength of the composite structure supporting a plurality of heat sources, the structure of the present invention may further include a plurality of reinforcing ribs on the top and/or bottom surfaces of the deck structure. Such reinforcing ribs may be integrally formed with the top and/or bottom surfaces of the deck structure, or alternatively, adhered (e.g., glued) to the deck structure. In instances where the deck structure is rectangular or square, the reinforcing ribs may extend from a first sidewall of the deck structure to a second sidewall of the deck structure, or, alternatively, 10 from a first end wall to a second end wall of the deck structure. In order to adequately support at least a first of the plurality of heat sources on the deck structure, the first of the plurality of heat sources may be interconnected to at least a first of the plurality of ribs. In one embodiment, at least the first of the plurality of heat sources is positionable on one of the top and bottom surfaces of the deck structure, between the first and a second of the plurality of reinforcing ribs. Additional heat sources may be positioned between and interconnected to the first and second of the plurality of reinforcing ribs on the other of the top and bottom surfaces of the deck structure, or positioned between and interconnected to the second and a third of the plurality of reinforcing ribs on either of the top and bottom surfaces of the deck structure, or positioned between and interconnected to the third and a fourth of the plurality of reinforcing ribs on either of the top and bottom surfaces of the deck structure.

For purposes of transferring heat energy from at least a first heat source, at least a first of the plurality of reinforcing ribs is capable of conductively transferring heat energy away from at least the first of the plurality of heat sources interconnected thereto. In one embodiment, at least the first of the plurality of reinforcing ribs includes a plurality of thermally conductive fibers packed within a matrix material. In this regard, the thermally conductive fibers of at least the first reinforcing rib may be oriented in a first direction (e.g., 0°) to transfer heat energy away from at least a first heat source interconnected thereto and/or toward another heat source interconnected to the deck structure. For example, in instances where a substantially rectangular deck structure is constructed in accordance with the principles of the present invention, the thermally conductive fibers of at least the first reinforcing rib may be oriented either orthogonal or parallel to the first and second opposing sidewalls of the deck structure to transfer heat energy away from at least the first heat source, depending upon whether the reinforcing ribs extend between the first and second sides or side walls of the deck structure, or extend between first and second end or end walls of the deck structure. In one embodiment, where a first of a plurality of layers of thermally conductive fibers are oriented substantially orthogonally relative to the first and second opposing sides or sidewalls of the deck structure, and the reinforcing ribs extend between the first and second sides of the deck structure, at least a first reinforcing rib includes at least a first of another (e.g., second) plurality of layers of thermally conductive fibers packed within a matrix material, the fibers of at least this first layer being oriented substantially orthogonally relative to the first and second sides of the deck structure to transfer heat energy from at least the first reinforcing rib towards the first and/or second side walls of the deck structure.

In instances where it is desirable to substantially maintain uniformity in temperature of a first and second heat source interconnected to a first reinforcing rib, at least the first reinforcing rib may further include at least another (e.g., second) layer of thermally conductive fibers packed within a matrix material for transferring heat energy from one heat source towards another heat source. In this embodiment, such fibers in this second layer are orientable substantially orthogonally relative to the fibers in the first layer.

In other instances, where it is desireable to enhance the strength and/or stiffness of at least the first reinforcing rib, at least the first reinforcing rib may include another (e.g., second) of the plurality of layers of fibers (e.g., thermally conductive or nonthermally conductive) packed within a matrix material. Fibers in this layer may be oriented in at least a second direction (e.g., between −90° and +90°, or substantially ±30°, ±45° and/or ±60° relative to the thermally conductive fibers of the first layer of the first reinforcing rib) to enhance the structural strength and/or stiffness of the first reinforcing rib and/or to enhance the heat transfer capability of the deck structure.

The deck structure of the present invention may also be interconnected to a cover to protect the heat sources mounted to the deck structure from the surrounding environment. For example, in instances where the support structure of the present invention will be utilized on a spacecraft, the cover can be attached to the deck structure to protect the heat sources interconnected thereto from micro-meteoroids hits. In one embodiment, for purposes of providing a lightweight, thermally conductive cover, the cover includes a plurality of layers of thermally conductive fibers packed within a matrix material, whereby the fibers in at least a first layer are oriented one of perpendicular and ±30°, ±45°, ±60° relative to the fibers in at least a second layer. In instances where the deck structure includes first and second end walls, such end walls may similarly comprise a plurality of layers of thermally conductive fibers packed within a matrix material.

DETAILED DESCRIPTION

Figure 1:
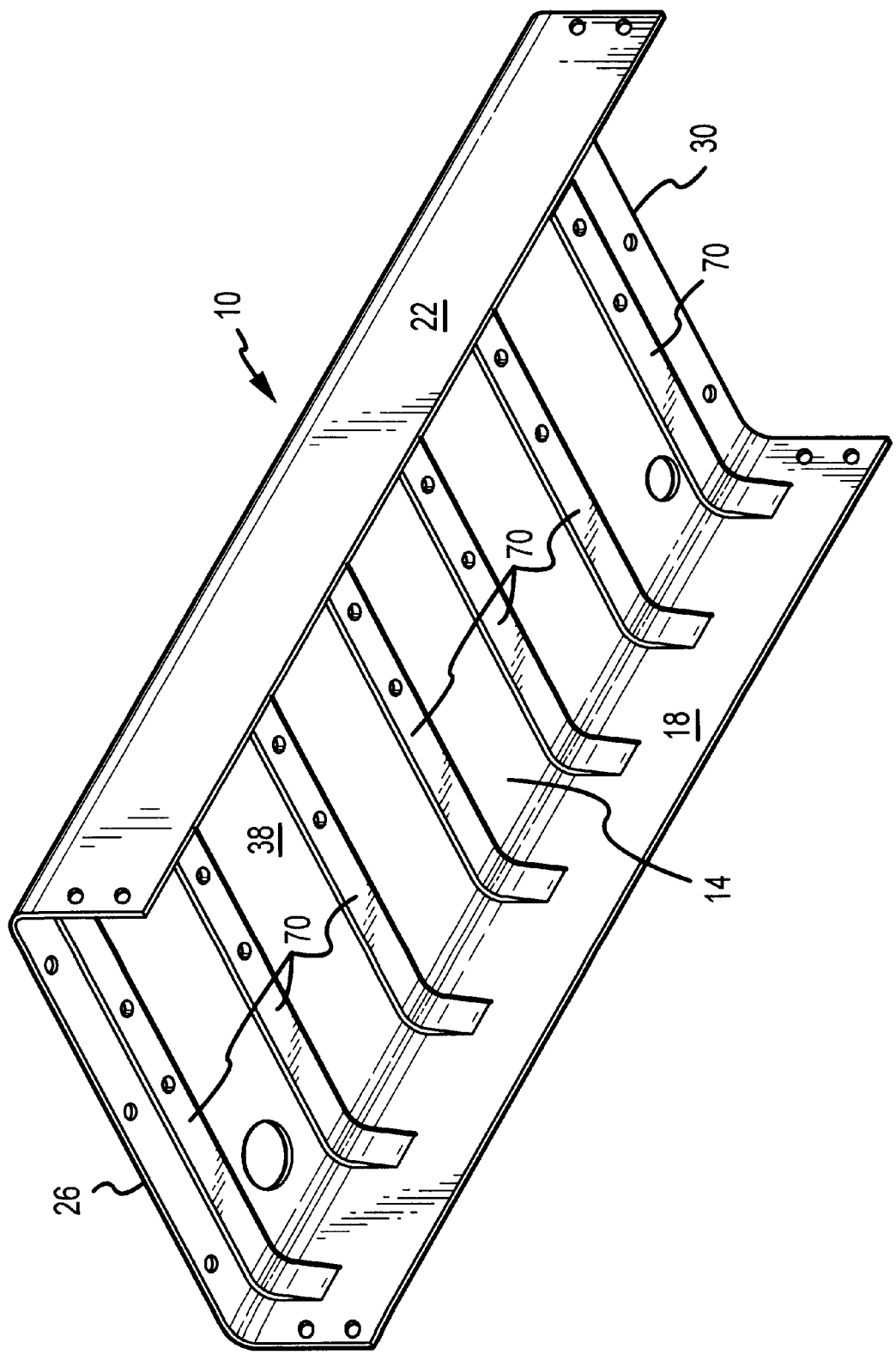
FIG. 1 illustrates a perspective view of one embodiment of the support structure of the present invention.
Figure 2:
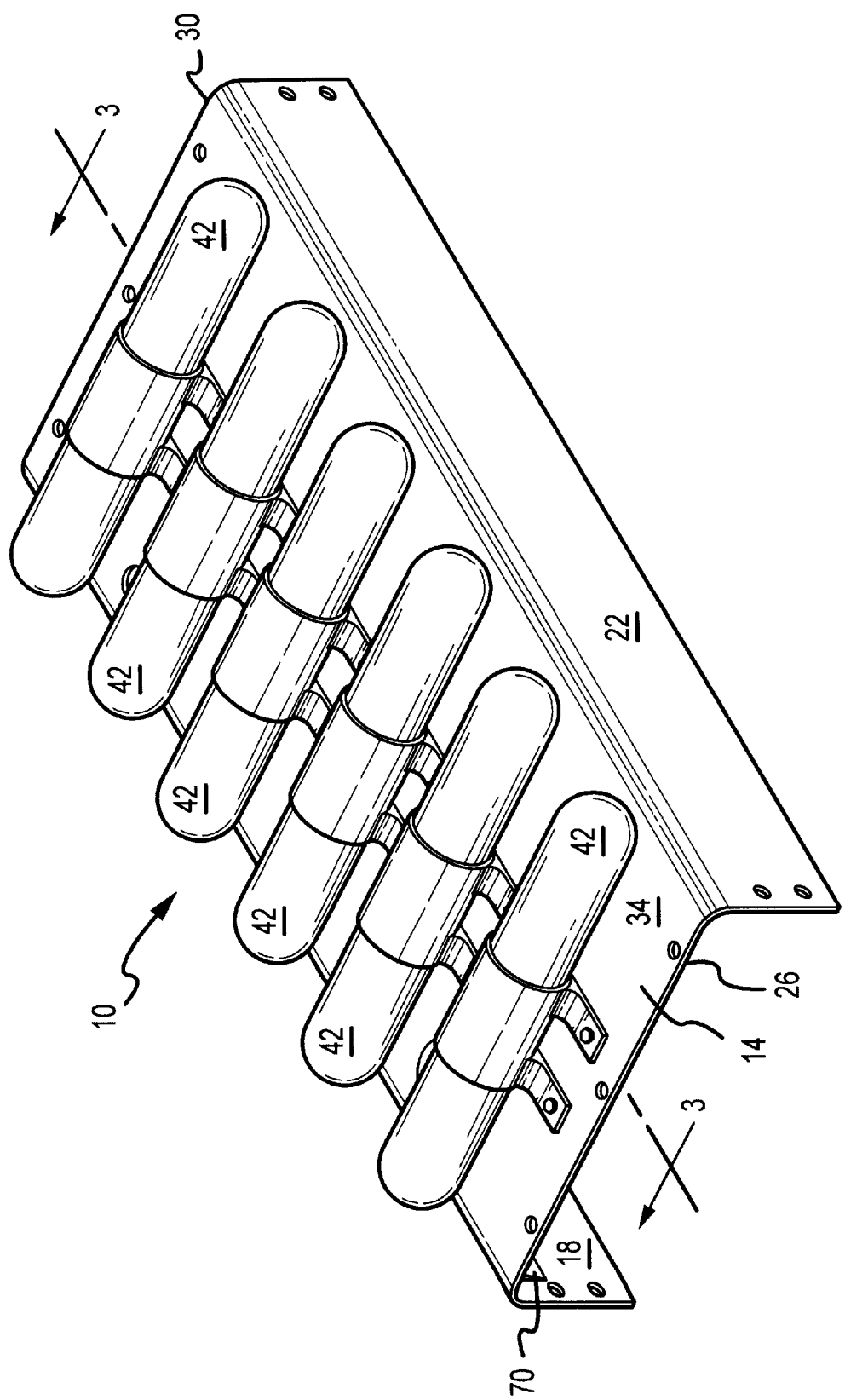
FIG. 2 illustrates a perspective view of the support structure illustrated in FIG. 1 having a plurality of heat sources interconnected thereto.
Figure 3:
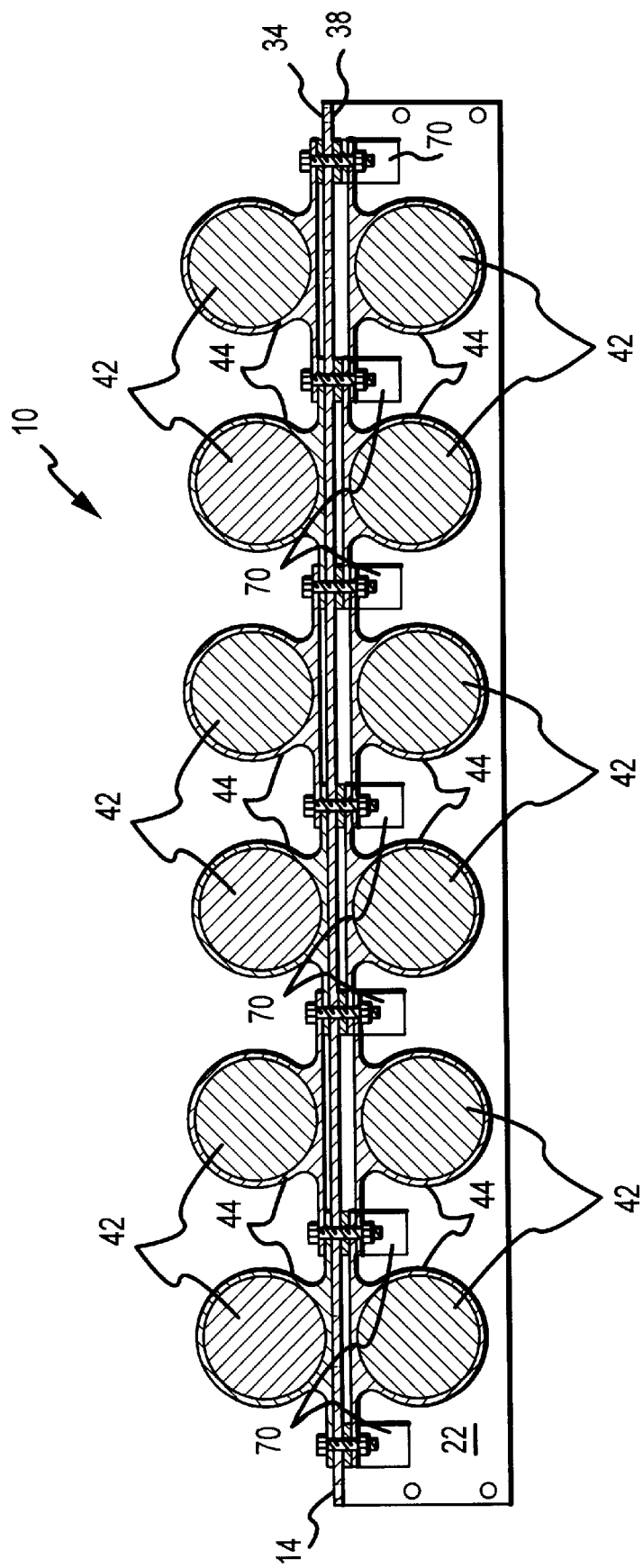
FIG. 3 illustrates a cross-sectional view of the support structure illustrated in FIG. 2, taken along line 3—3.
Figure 4:
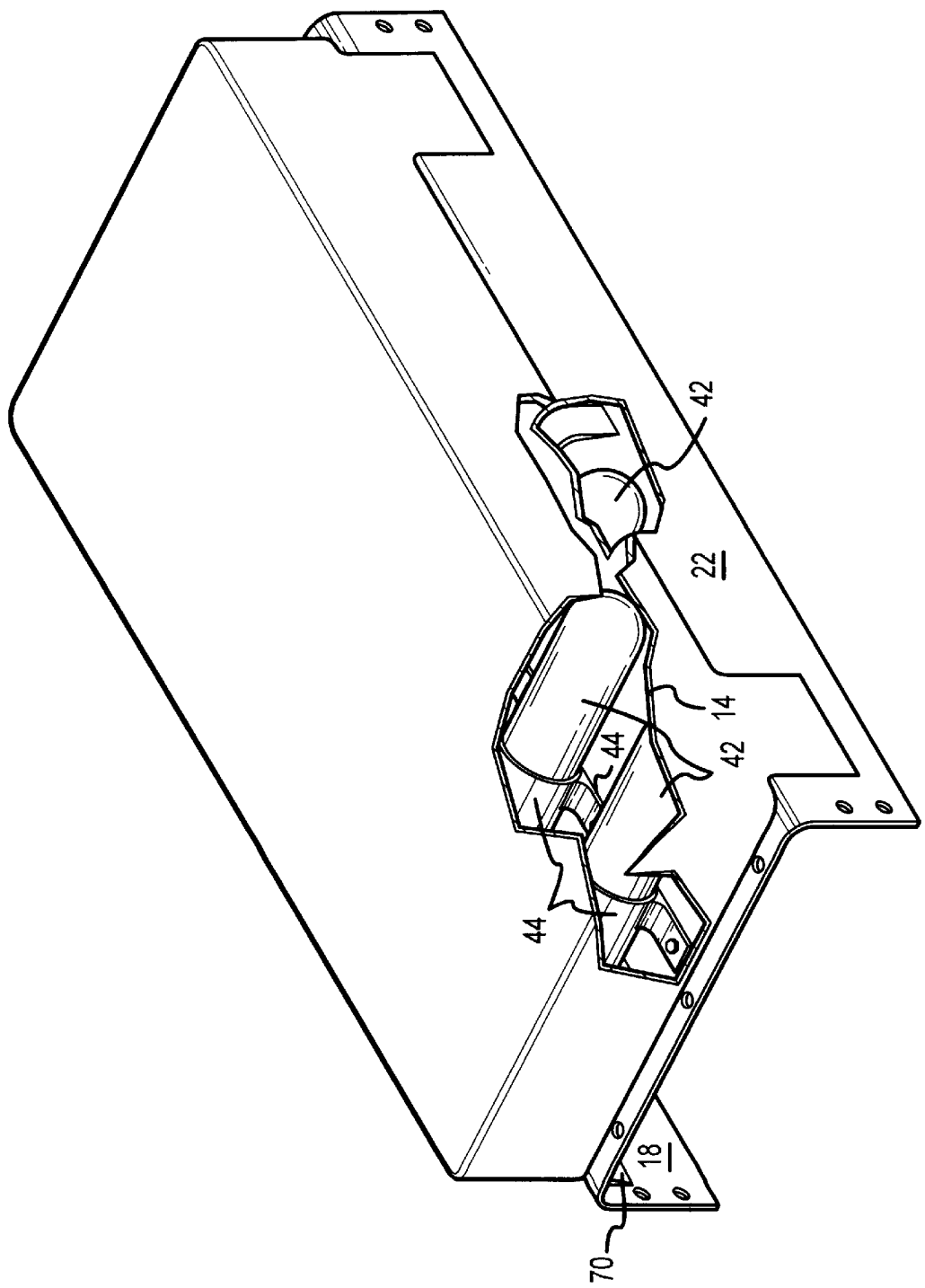
FIG. 4 illustrates another embodiment of the support structure of the present invention in combination with a protective cover.

FIGS. 1–7 illustrate the various features and embodiments of the support structure of the present invention. Generally, and referring to FIGS. 1–4, the support structure 10 of the present invention includes a substantially rectangular deck structure 14 having first and second sides or sidewalls 18, 22 and first and second ends or endwalls 26, 30. In this embodiment, the first and second laterally spaced (e.g., opposing) sidewalls 18, 22 are integrally formed with the deck structure 14 and extend below the top and bottom surfaces 34, 38 of the deck structure 14 to enable the deck structure 14 to support a plurality of heat sources 42 interconnected thereto. For example, and as illustrated in FIGS. 2–3, such configuration allows a plurality of heat sources 42 to be interconnected to either or both the top and bottom surfaces 34, 38 of the deck structure 14 (which will be described in more detail hereinbelow). In this regard, the first and second sidewalls 18, 22 function to at least support the deck structure 14 and the plurality of heat sources 42 interconnected to the deck structure 14.

In one embodiment, the composite support structure 10 of the present invention further includes a plurality of reinforcing ribs 70 for enhancing the structural strength and/or stiffness of the deck structure 14. In this regard, the support structure 10 is capable of supporting a plurality of heat sources 42 thereon during various loading conditions (e.g., launch loads). Such reinforcing ribs 70 extend between the first and second sidewalls 18, 22 of the support structure 10 and are spaced apart from each other. In one embodiment, the heat sources 42 are positionable on the top and/or bottom surfaces 34, 38 of the deck structure 14, between adjacent ribs 70, and are interconnectable to the reinforcing ribs 70 via mounting clamps 44 or other suitable fastening devices, as illustrated in FIGS. 2–3. In order to transfer heat energy from the heat sources 42 to at least the ribs 70 and deck structure 14, the clamps 44 are thermally conductive (e.g., fabricated from a thermally conductive material, such as aluminum).

In accordance with the present invention, each of the thermally conductive fibers preferably transfers heat energy axially (e.g., 0°, along a longitudinal axis of each fiber). In one embodiment, the thermally conductive fibers are fabricated from a lightweight, composite material, such as graphite, having a high thermal conductivity (e.g., at least 200 W/m-K). Such fibers are packable or embeddable within a lightweight matrix material, whereby the packing density of fibers within the matrix material is at least about 50%, and, in a preferred embodiment, is between about 50% and about 60%, and, in another preferred embodiment, is about 58%. In this regard, some of the thermally conductive fibers contact each other while other fibers are spaced apart with matrix material extending therebetween. As such, the matrix material may or may not be thermally conductive (e.g., at least about 1 W/m-K), such that both the fibers and matrix material may be capable of conducting heat energy. In one embodiment, the fibers comprise K13C2U, K1100 or P120 graphite fibers, which are commercially available from various vendors, such as Bryte Technologies, and the matrix material comprises a polycynate (e.g., EX1515, which is commercially available from Bryte Technologies), an epoxy, thermoplastic or graphitized carbon.

Figure 5:
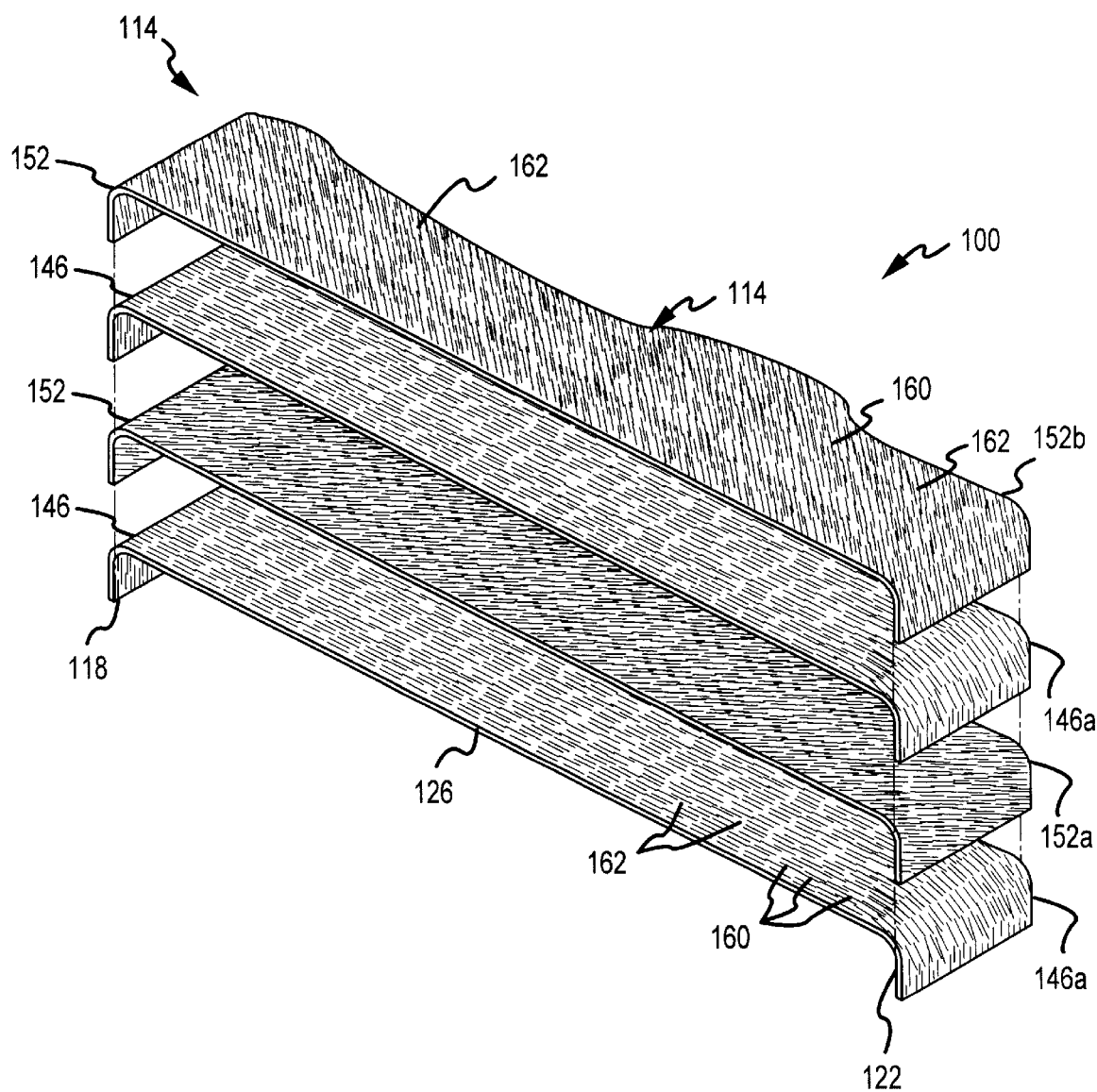
FIG. 5 is an exploded, cut-away view of a plurality of layers of thermally conductive fibers packed within a matrix material, the layers being engagable to each other to form one embodiment of the support structure of the present invention.
Figure 6:
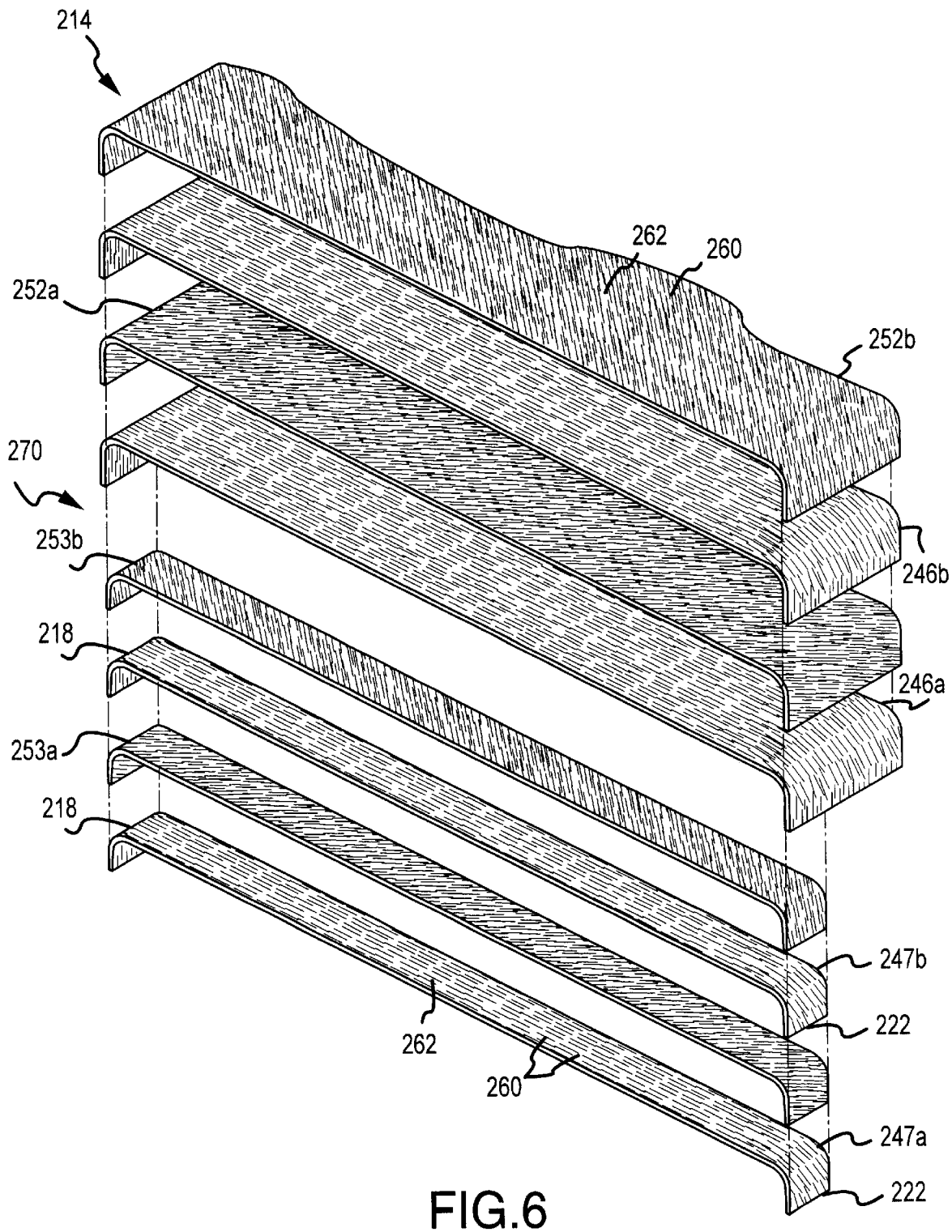
FIG. 6 is an exploded, cut-away view of a plurality of layers of thermally conductive fibers packed within a matrix material, the layers being engagable to each other to form another embodiment of the support structure of the present invention.
Figure 7:
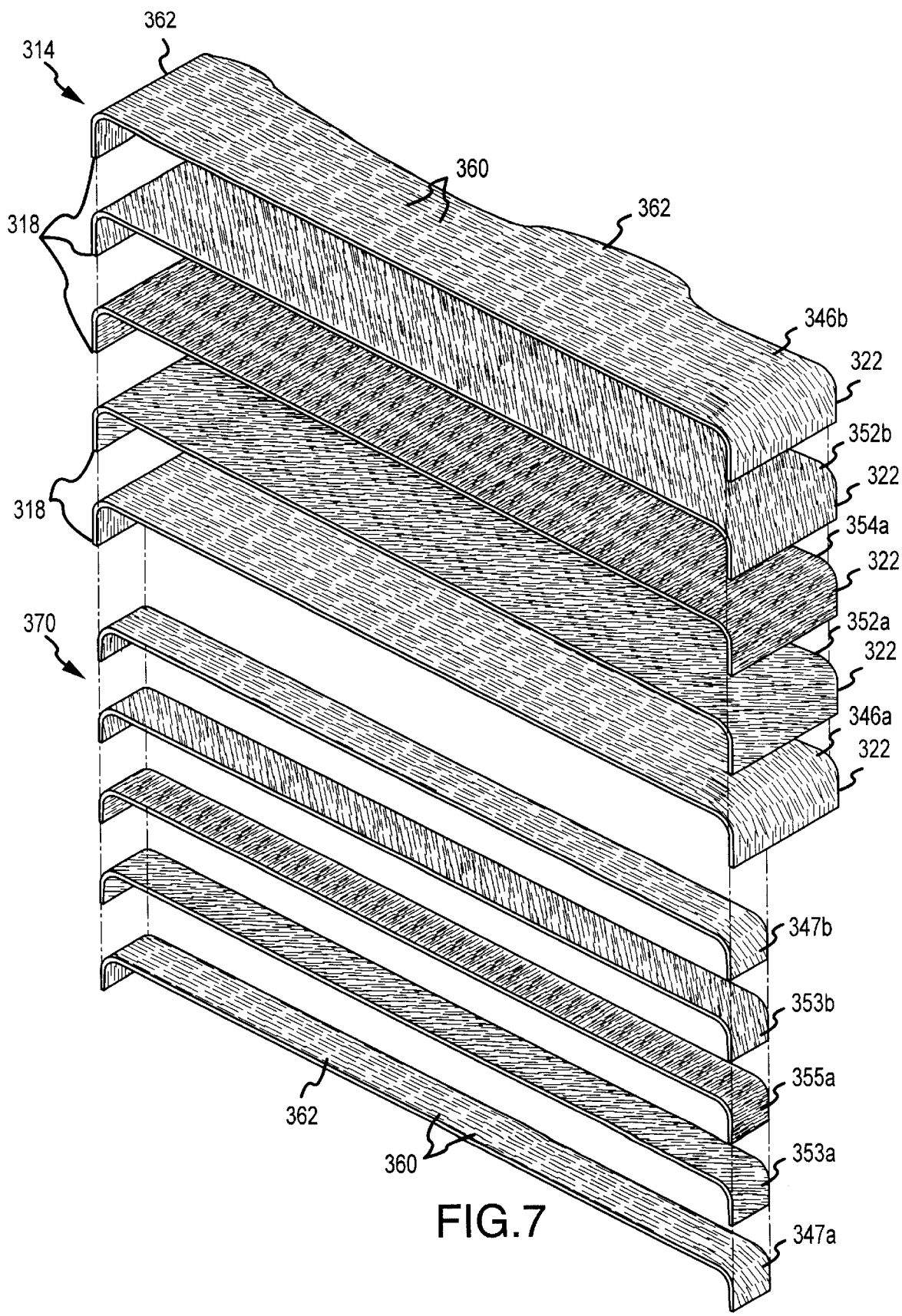
FIG. 7 is an exploded, cut-away view of a plurality of layers of thermally conductive fibers packed within a matrix material, the layers being engagable to each other to form yet another embodiment of the support structure of the present invention.

For purposes of providing a composite support structure capable of transferring heat energy at least away from at least a first heat source, at least the deck structure of the present invention includes a plurality of layers of thermally conductive fibers packed within a matrix material. Such plurality of layers of thermally conductive fibers may also be used in fabricating the sidewalls, end walls and/or reinforcing ribs of the support structure of the present invention. FIGS. 5–7 illustrate exploded, cut-away views of different embodiments of the some of the layers of the thermally conductive fibers packed within a matrix material. Since the deck structure and reinforcing ribs of the support structure of the present invention utilize numerous layers of thermally conductive fibers packed within matrix material, FIGS. 5–7 illustrate only a portion of the layers actually required to fabricate a support structure of the present invention (as will be explained in more detail hereinbelow). In addition, for ease of illustration, only a portion of the deck structure is shown.

In one embodiment of the support structure of the present invention, illustrated in FIG. 5, at least the deck structure 114 includes at least a first plurality of layers 146 of thermally conductive fibers packed within a matrix material. For purposes of transferring heat energy from a first heat source at least toward the first and second sidewalls, at least a first layer 146a of thermally conductive fibers 160 packed within the matrix material 162 includes a plurality of fibers 160 oriented to point toward the first and/or second sidewalls 118, 122 (e.g., 0°), such that the fibers 160 are substantially orthogonal relative to the first and second sidewalls 118, 122 of the deck structure 114. In this regard, at least the first layer 146a of thermally conductive fibers 160 is capable of transferring heat energy from a heat source interconnected to the deck structure 114 to the first and/or second sidewalls 118, 122, at which point the heat energy may be dissipated into the environment convectively or radiatively, or by other conventional means (e.g., conductively). Alternatively, in instances where it is desirable to transfer heat energy from the heat sources at least one of the ends (e.g., end wall 126) of the deck structure, the fibers in the first plurality of layers may be oriented substantially orthogonally relative to the ends (e.g., substantially parallel to the first and second sidewalls) (not shown).

In order to provide a composite structure capable of supporting a plurality of heat sources interconnected thereto, the deck structure 114 further includes at least a second plurality of layers 152 of thermally conductive fibers 160 packed within a matrix material. Fibers 160 in each of the second plurality of layers 152 (e.g., 152a, 152a) are oriented ±45° relative to the fibers 160 of the first plurality of layers 146. In this regard, the deck structure 114 includes a plurality of layers 146, 152 of thermally conductive fibers 160 embedded within the matrix material 162, whereby fibers 160 in the first plurality of layers 146 transfer heat energy from the heat sources interconnected to the deck structure 114 towards the first and second sidewalls 118, 122 and fibers 160 in the second plurality of layers 152 provide structural strength and/or stiffness to the deck structure 114 while transferring heat energy generally towards the first and second sidewalls 118, 122 and/or the ends (e.g., end 126) of the support structure. Such layers 146, 152 of thermally conductive fibers packed within a matrix material are co-cured, which makes the layers 146, 152 stick together. In instances where the side walls 118, 122 are integrally formed with the deck structure 114, the side walls 118, 122 similarly include the plurality of layers 146, 152 of thermally conductive fibers 160 embedded within the matrix material 162. Of course, the side walls 118, 122 may include the plurality of layers 146, 152 of thermally conductive fibers 160 embedded within the matrix material even if such sidewalls 118, 122 are not integrally formed with the deck structure 114. In addition, since the layers 146, 152 can be relatively thin (e.g., 0.0028 inches thick), and many more layers 146, 152 are required to fabricate a deck structure 114 of sufficient structural strength, only a few layers 146, 152 are illustrated in FIG. 5 for purposes of clarity. In this regard, the stack of co-cured layers 146, 152 illustrated in FIG. 5 may be repeated a number of times to produce a deck structure 114 and side walls 118, 122. In alternate embodiments, the stack of co-cured layers comprises a first plurality of layers of thermally conductive fibers oriented in a first direction (e.g., 0°), and a second plurality of layers of thermally conductive fibers oriented in at least a second direction (e.g., ±30°, ±60°) to enhance the structural strength/stiffness and/or thermal conductivity of the deck structure.

As noted hereinabove, for purposes of further enhancing the structural strength and/or stiffness of the support structure, in another embodiment, the support structure of the present invention further includes a plurality of reinforcing ribs extending between the first and second sidewalls. In one embodiment, illustrated in FIGS. 1–4, the reinforcing ribs 70 are integrally formed on the bottom surface 38 of the deck structure 14. Alternatively, such ribs may be bonded (e.g., glued) to the deck structure. In order to provide structural strength and to enable the reinforcing ribs to transfer heat energy at least away from the heat sources towards the first and/or second sidewalls, the reinforcing ribs comprise a plurality of thermally conductive fibers embedded or packed within a matrix material. As illustrated in FIG. 6, the reinforcing ribs 270 comprise a plurality of layers 247, 253 of thermally conductive fibers 260 embedded in a matrix material 262, whereby the thermally conductive fibers 260 in the first plurality of layers 247 are oriented to point toward the first and/or second sidewalls 218, 222 (e.g., 0°), such that the fibers 260 are substantially orthogonal relative to the first and/or second sidewalls 218, 222, and, for structural strength, the thermally conductive fibers 260 in the second plurality of layers 253 are oriented substantially ±45° relative to the fibers 260 of the first plurality of layers 247. As such, the fibers 260 of the first plurality of layers 247 of the reinforcing ribs 270 and the first plurality of layers 246 of the deck structure 214 are oriented in the same direction to transfer heat energy from the heat sources mounted to the ribs 270 toward the first and/or second sidewalls 218, 222 via at least the thermally conductive clamps interconnecting the heat sources to the reinforcing ribs. In addition, the deck structure 214 includes a second plurality of layers 252 having a plurality of thermally conductive fibers 260 embedded within a matrix material 262, the fibers 260 of these layers 252 being oriented substantially ±45° relative to the fibers 260 of the first plurality of layers 246 for enhancing the structural strength of the deck structure 214. Alternatively, such fibers may be oriented at other angles (e.g., ±30°, ±60°) relative to the fibers of the first plurality of layers. And, since the layers 246, 247, 252, 253 can be relatively thin (e.g., 0.0028 inches thick), and many more layers 246, 247, 252, 253 are required to fabricate a deck structure 214 of sufficient structural strength, only a few layers are illustrated in FIG. 6. In this regard, the stack of co-curable layers 246, 252 illustrated in FIG. 6 may be repeated a number of times to produce a deck structure 214 and side walls 218, 222, and the stack of co-curable alternating layers 247, 253 may be repeated a number of times to produce a single reinforcing rib 270.

In some instances, where the heat sources interconnected to the support structure are battery cells, it is important to not only cool the battery cells, but also to ensure the battery cells operate at substantially the same temperature to enhance the useable life of the battery cells. In this regard, the support structure of the present invention is capable of conductively transferring heat energy away from the heat sources, towards the first and/or second sidewalls of the support structure, and conductively transferring heat energy from one battery cell to another battery cell. In one embodiment of the present invention, a support structure, substantially illustrated in FIGS. 1 and 7 for supporting and for conductively transferring heat energy away from and towards a plurality of heat sources interconnected thereto includes a deck structure 314 having a plurality of reinforcing ribs 370 integrally formed on the bottom surface thereof, first and second sidewalls and first and second ends. Substantially as described hereinabove with respect to other embodiments of the support structure, and as illustrated in FIG. 7, at least the deck structure 314 includes first and second pluralities of layers 346, 352 of thermally conductive fibers 360 embedded within a matrix material 362, whereby the fibers 360 of the first plurality of layers 346 (e.g., 346a, 346b, etc.) are oriented substantially orthogonally relative to the first and second sidewalls 318, 322 (e.g., 0°) to transfer heat energy from the heat sources interconnected thereto at least towards the first and/or second sidewalls 318, 322, and the fibers 360 of the second plurality of layers 352 (e.g., 352a, 352b, etc.) are oriented substantially ±45° relative to the fibers 360 of the first plurality of layers 346 to enhance the structural strength of the deck structure 314. Further, and as noted hereinabove with respect to the support structure in other embodiments, for purposes of enhancing the structural strength of the deck structure 314 while providing thermal conductivity, the support structure further includes a plurality of reinforcing ribs 370 extending between the first and second sidewalls 318, 322, the ribs 370 comprising thermally conductive fibers 360 embedded within a matrix material 362. Such ribs 370 similarly include first and second pluralities 347, 353 of layers of thermally conductive fibers 360 packed within the matrix material, whereby the fibers 360 of the first plurality of layers 347 (e.g., layers 347a, 347b, etc.) are oriented substantially orthogonally relative to the first and second sidewalls 318, 322 (e.g., 0°) to conductively transfer heat energy towards at least one of the first and/or second sidewalls 318, 322, and the fibers 360 of the second plurality of layers 353 (e.g., layers 353a, 353b, etc.) are oriented substantially ±45° relative to the fibers 360 of the first plurality of layers 347 to enhance the structural strength of the ribs 370. Further, the battery cells are positionable between and interconnectable to the reinforcing ribs 370 via thermally conductive clamps. Alternatively, the fibers may be oriented at other angles (e.g., substantially ±30°, ±60°, etc.) relative to the fibers of the first plurality to enhance the structural strength/stiffness and/or the thermal conductivity of the deck structure and/or reinforcing ribs.

For purposes of substantially maintaining uniformity in temperatures of the battery cells interconnected to the deck structure 314 via the reinforcing ribs 370, the deck structure 314 and reinforcing ribs 370 each further include a third plurality of layers 354, 355, respectively, of thermally conductive fibers 360 packed within a matrix material 362, whereby the fibers 360 in these third pluralities of layers 354, 355 are oriented substantially orthogonally relative to the fibers 360 in the first pluralities of layers 352, 353 (e.g., 90° or substantially parallel to the first and second sidewalls 318, 322) to transfer heat energy from a first battery cell to another, second battery cell when the second battery cell is operating at a temperature less than the first battery cell.

In instances where the deck structure 314 includes the first, second and third pluralities of layers 346, 352, 354 of thermally conductive fibers 360 packed within a matrix material, and the reinforcing ribs 370 includes the first, second and third pluralities of layers 347, 353, 355 of thermally conductive fibers 360 packed within matrix material, these layers of the deck structure 314 and of the reinforcing ribs 370 are stackable on each other, in a generally repeating order. For example, areas of the deck structure 314, located between reinforcing ribs 370, may include, in a repeating fashion, the following layers of thermally conductive fibers 360 packed within the matrix material: (1) a first layer 346a of the first plurality of layers 346 having a plurality of thermally conductive fibers 360 oriented substantially orthogonally relative to the first and second sidewalls 318, 322 (e.g., 0°) to transfer heat energy towards such sidewalls 318, 322, (2) a first layer 352a of the second plurality of layers 352 having a plurality of thermally conductive fibers 360 oriented −45° relative to the fibers 360 of the first layer 346a to enhance the structural strength of the deck structure 314, (3) a first layer 354a of the third plurality 354 having a plurality of thermally conductive fibers 360 oriented orthogonally relative to the fibers 360 of the first layer 346a (e.g., 90°) to transfer heat energy from a first heat source to a second, cooler heat source, (4) a second layer 352b of the second plurality of layers 352 having a plurality of fibers 360 oriented +45° relative to the fibers 360 of the first layer 346a of the first plurality of layers 346 to enhance the structural strength of the deck structure 314, and (5) a second layer 346b of the first plurality of layers 346 having a plurality of fibers 360 oriented orthogonally relative to the first and second sidewalls 318, 322 (e.g., 0°) to transfer heat energy from at least a first heat source towards the first and/or second sidewalls 318, 322. Such stacking of the layers 346a, 352a, 354a, 352b, 346b may be repeated a number of times to fabricate the deck structure 314. For instance, where each layer is about 0.0028 inches thick, and a desired thickness of the deck structure 314, between the ribs 370, is about 0.060 inches, the above-described stacking may be repeated numerous times. Of course, the stacking order of at least the first and second layers 352a, 352b of the second plurality of layers 352 may be interchanged with one another. In addition, in instances where the first and second sidewalls 318, 322 are integrally formed with the deck structure 314, the first and second sidewalls 318, 322 may include a similar stacking of the first, second and third pluralities of layers 346, 352, 354. The end walls may also include the above-described first, second and/or third pluralities of layers of fibers embedded within a matrix material. In alternative embodiments, where there is no need to maintain uniformity in temperatures of the heat sources, the layup comprises pluralities of layers of thermally conductive fibers oriented ±30° and/or ±60° relative to a first plurality of layers of thermally conductive fibers which are oriented in a first direction (e.g., ±0°).

Similarly, each reinforcing rib 370, a portion of one of which is illustrated in FIG. 7, can include the following layers of thermally conductive fibers 360 packed within the matrix material: (1) a first layer 347a of the first plurality of layers 347 having a plurality of thermally conductive fibers 360 oriented substantially orthogonally relative to the first and second sidewalls 318, 322 (e.g., 0°) to transfer heat energy towards such sidewalls 318, 322, (2) a first layer 353a of the second plurality of layers 353 having a plurality of thermally conductive fibers 360 oriented −45° relative to the fibers 360 of the first layer 347a to enhance the structural strength of the rib 370, (3) a first layer 355a of the third plurality 355 having a plurality of thermally conductive fibers 360 oriented orthogonally relative to the fibers 360 of the first layer 347a (e.g., 90°) to transfer heat energy from a first heat source to a second, cooler heat source, (4) a second layer 353b of the second plurality of layers 353 having a plurality of fibers 360 oriented +45° relative to the fibers 360 of the first layer 347a of the first plurality of layers 347 to enhance the structural strength of the rib 370, and (5) a second layer 347b of the first plurality of layers 347 having a plurality of fibers 360 oriented orthogonally relative to the first and second sidewalls 318, 322 (e.g., 0°) to transfer heat energy from at least a first heat source towards the first and/or second sidewalls 318, 322. Such stacking of the layers 347a, 353a, 355a, 353b, 347b may be repeated a number of times to fabricate each rib 370. For instance, where each layer is about 0.0028 inches thick, and a desired thickness of each rib 370 is about 0.25 inches, the above-described stacking may be conducted numerous times. Of course, the stacking order of at least the first and second layers 353a, 353b of the second plurality of layers 353 may be interchanged with one another. In alternative embodiments, where there is no need to maintain uniformity in temperatures of the heat sources, the layup of the reinforcing ribs comprises pluralities of layers of thermally conductive fibers oriented ±30° and/or ±60° relative to a first plurality of layers of thermally conductive fibers which are oriented in a first direction (e.g., ±0°).

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A thermally conductive structure for supporting at least a first of a plurality of heat sources, said structure comprising:
   a first deck member having top and bottom facesheets and at least a first sidewall, wherein the first of the plurality of heat sources is interconnectable to one of said top and bottom facesheets of said first deck member;
   wherein at least said first deck member comprises a first plurality of layers of thermally conductive fibers in a matrix material, said fibers being oriented in a first direction and having a thermal conductivity of at least about 200 W/m-K to transfer heat away from the first of the plurality of heat sources, in said first direction; and
   a plurality of reinforcing ribs extending across one of said top and bottom facesheets of said first deck member, wherein the first of the plurality of heat sources is interconnected to said first deck member via a first of said plurality of reinforcing ribs.

2. A thermally conductive structure, as claimed in claim 1, wherein said fibers of said first plurality of layers of thermally conductive fibers are oriented substantially orthogonally relative to said first sidewall to transfer heat from the first of the plurality of heat sources toward at least said first sidewall.

3. A thermally conductive structure, as claimed in claim 1, further comprising:
   a second plurality of layers of thermally conductive fibers oriented in a second direction different than said first direction, wherein a first of said first plurality of layers of thermally conductive fibers is curable with a first of said second plurality of layers of thermally conductive fibers.

4. A thermally conductive structure, as claimed in claim 1, wherein said plurality of reinforcing ribs are integrally formed with said one of said top and bottom facesheets.

5. A thermally conductive structure, as claimed in claim 1, wherein said first of said plurality of reinforcing ribs comprises a second plurality of layers of thermally conductive fibers.

6. A thermally conductive structure, as claimed in claim 1, wherein said first of said plurality of reinforcing ribs comprises a second plurality of layers of thermally conductive fibers, wherein said fibers in said second plurality of layers of thermally conductive fibers are oriented in said first direction to transfer heat from the first of the plurality of heat sources.

7. A thermally conductive structure, as claimed in claim 1, wherein the first of the plurality of heat sources is interposed between said first and a second of said plurality of reinforcing ribs, said structure further comprising:
   means for transferring heat from the first of the plurality of heat sources to at least one of said first and second reinforcing ribs.

8. A thermally conductive structure, as claimed in claim 7, wherein said means for transferring heat comprises at least a first mount structure extending between and interconnecting the first of the plurality of heat sources to said first and second reinforcing ribs.

9. A thermally conductive structure, as claimed in claim 7, wherein at least a second of the plurality of heat sources is interconnectable to the other of said top and bottom facesheets, opposite the first of the plurality of heat sources, wherein the second of the plurality of heat sources is interposable between and interconnectable to said first and second reinforcing ribs.

10. A thermally conductive structure for supporting a first of a plurality of heat sources, said structure comprising:
   a deck support structure having a first plurality of layers of thermally conductive fibers packed within a first matrix material, said deck support structure having a first sidewall; and
   a plurality of reinforcing ribs on at least one of top and bottom surfaces of said deck support structure, said plurality of reinforcing ribs being spaced relative to one another, wherein the first of the plurality of heat sources is interconnected to a first of said plurality of reinforcing ribs;
   wherein a first of said first plurality of layers includes a first portion of fibers oriented in a first direction to transfer heat energy from the first of the plurality of heat sources toward said first sidewall, wherein a second of said first plurality of layers includes a second portion of fibers oriented in a second direction to transfer heat energy from the first of the plurality of heat sources toward a second of the plurality of heat sources.

11. A structure, as claimed in claim 10, wherein said first portion of fibers are oriented substantially orthogonally relative to said first sidewall and said second portion of fibers are oriented parallel to said first sidewall, said first direction being 90° offset from said second direction.

12. A structure, as claimed in claim 10, wherein said first and second portions of fibers are oriented orthogonally relative to said first sidewall, said first and second directions being the same.

13. A structure, as claimed in claim 10, wherein said first portion of fibers are oriented substantially orthogonally relative to said first sidewall and said second portion of fibers are oriented between about 0° and about 90° relative to said first portion of fibers.

14. A structure, as claimed in claim 10, wherein said deck support structure includes a third of said first plurality of layers having a third portion of fibers oriented in a third direction different than said first and second directions.

15. A structure, as claimed in claim 14, wherein said third portion of fibers is oriented about ±45° relative to at least one of said first and second portions of fibers.

16. A structure, as claimed in claim 10, wherein said first of said plurality of reinforcing ribs includes at least a first and a second of a second plurality of layers having thermally conductive fibers packed in a second matrix material.

17. A structure, as claimed in claim 16, wherein at least one of said first and second of said second plurality of layers is oriented along a longitudinal axis of said first of said plurality of reinforcing ribs to conduct heat energy away from the first of the plurality of heat sources.

18. A structure, as claimed in claim 16, wherein one of said first and second of said second plurality of layers is oriented at least ±45° relative to the other of said first and second of said second plurality of layers.

19. A structure, as claimed in claim 10, wherein said fibers in said first matrix material of at least said first of said first plurality of layers have a packing density at least about 50%.

20. A structure, as claimed in claim 10, wherein said first matrix material comprises a material selected from the group consisting of polycynate and graphitized carbon.

21. A structure, as claimed in claim 10, wherein the first of the plurality of heat sources is interconnected to at least one of said first and a second of said plurality of reinforcing ribs, on one of said top and bottom surfaces of said deck support structure, and a second of the plurality of heat sources is mountable to the other of said top and bottom surfaces of said deck support structure.

22. A structure, as claimed in claim 10, further comprising:
    means for interconnecting the first of the plurality of heat sources to said first of said plurality of reinforcing ribs.

23. A structure, as claimed in claim 22, wherein said means for interconnecting comprises a means for transferring heat energy from the first of the plurality of heat sources to said first of said plurality of reinforcing ribs.

24. A structure, as claimed in claim 10, wherein at least one of said first and second portion of fibers comprise graphite.

25. A structure, as claimed in claim 10, wherein at least a first of said first portion of fibers oriented in said first direction contacts at least a first of said second portion of fibers oriented in said second direction.

26. A thermally conductive structure for supporting at least first and second heat sources, said structure comprising:
    a first deck member having top and bottom facesheets, wherein the first and second heat sources are interconnectable to one of said top and bottom facesheets of said first deck member;
    wherein said first deck member comprises a first plurality of thermally conductive fibers to transfer heat away from one of the first and second heat sources toward the other of the first and second heat sources, wherein said first plurality of thermally conductive fibers is positionable between the first and second heat sources, wherein at least a first of said first plurality of thermally conductive fibers has a first longitudinal axis oriented toward one of the first and second heat sources; and
    a plurality of reinforcing ribs extending over one of said top and bottom facesheets of said first deck member wherein the first heat source is interconnected to said first deck member via a first of said plurality of reinforcing ribs.

27. A thermally conductive structure, as claimed in claim 26, wherein said first plurality of thermally conductive fibers have a thermal conductivity of at least about 200 W/m-K.

28. A thermally conductive structure, as claimed in claim 26, further comprising a second plurality of thermally conductive fibers oriented substantially orthogonally relative to said first of said first plurality of thermally conductive fibers to transfer heat from at least one of the first and second heat sources to at least a first sidewall of said first deck member.

29. A thermally conductive structure, as claimed in claim 26, wherein said plurality of reinforcing ribs are integrally formed with said one of said top and bottom facesheets.

30. A thermally conductive structure, as claimed in claim 26, wherein at least said first of said plurality of reinforcing ribs comprises at least a second plurality of thermally conductive fibers.

31. A thermally conductive structure, as claimed in claim 26, wherein said first of said plurality of reinforcing ribs comprises at least a second plurality of thermally conductive fibers, wherein at least a first of said second plurality of thermally conductive fibers is oriented substantially parallel to said first of said first plurality of thermally conductive fibers to transfer heat from one of the first and second heat sources toward the other of the first and second heat sources.

32. A thermally conductive structure, as claimed in claim 26, wherein said first deck member comprises a second plurality of thermally conductive fibers, wherein at least a first of said second plurality of thermally conductive fibers is oriented ±45° relative to said first of said first plurality of thermally conductive fibers.

* * * * *